US008704092B2

(12) United States Patent
Zhang

(10) Patent No.: US 8,704,092 B2
(45) Date of Patent: Apr. 22, 2014

(54) FACEPLATE WITH DUST-PROOF SHUTTER

(75) Inventor: LuJun Zhang, Shanghai (CN)

(73) Assignee: Raychem Shanghai Cable Accessories Ltd., Shanghai (CN)

( * ) Notice: Subject to any disclaimer, the term of this patent is extended or adjusted under 35 U.S.C. 154(b) by 1 day.

(21) Appl. No.: 13/143,046

(22) PCT Filed: Dec. 18, 2009

(86) PCT No.: PCT/IB2009/055837

§ 371 (c)(1),
(2), (4) Date: Nov. 10, 2011

(87) PCT Pub. No.: WO2010/076729

PCT Pub. Date: Jul. 8, 2010

(65) Prior Publication Data

US 2012/0118604 A1 May 17, 2012

(30) Foreign Application Priority Data

Dec. 30, 2008 (CN) .......................... 2008 1 0205398

(51) Int. Cl.
*H02G 3/14* (2006.01)
*H05K 5/03* (2006.01)

(52) U.S. Cl.
USPC ............................................... 174/67; 174/66

(58) Field of Classification Search
USPC ............... 174/66, 67; 220/241, 242; 439/135, 439/136, 143-147; D8/353; D13/177
See application file for complete search history.

(56) References Cited

U.S. PATENT DOCUMENTS 2,552,061 A 5/1951 Popp
(Continued)

FOREIGN PATENT DOCUMENTS

| | | | |
|---|---|---|---|
| EP | 0598192 | A1 | 5/1994 |
| EP | 1830618 | A1 | 9/2007 |
| FR | 2865609 | A1 | 7/2005 |
| WO | WO 2005/025007 | A1 | 3/2005 |

OTHER PUBLICATIONS

International Search Report and Written Opinion issued by the European Patent Office, dated Apr. 22, 2010, for PCT/IB2009/055837; 13 pages.

*Primary Examiner* — Jenny L Wagner
*Assistant Examiner* — Ahmad D Barnes
(74) *Attorney, Agent, or Firm* — Faegre Baker Daniels LLP

(57) ABSTRACT

The present invention discloses to a faceplate with a dust-proof shutter (10). In one embodiment, the faceplate includes: a faceplate body (1); a connection port (4) provided in the faceplate body and adapted for plugging and unplugging; a dust-proof shutter for covering the connection port. The dust-proof shutter can move between a closed position and an opened position so that the connection port is switched between a closed state and an opened state; and a dust-proof shutter locating unit (30, 21, 22) is able to locate the dust-proof shutter in the closed position and the opened position respectively, in response to the action of the dust-proof shutter. Particularly, the dust-proof shutter can be held in an opened position where the connection port is in an opened state, and also the dust-proof shutter is capable of being timely returned to a closed position once the connection port needs to be closed.

20 Claims, 6 Drawing Sheets

(56) References Cited

U.S. PATENT DOCUMENTS

| | | | | |
|---|---|---|---|---|
| 5,198,618 | A | 3/1993 | Shieh | |
| 6,030,238 | A | 2/2000 | Dong | |
| 6,602,081 | B1 | 8/2003 | Wang | |
| 6,648,677 | B1 * | 11/2003 | Boyd | 439/501 |
| 7,005,580 | B1 * | 2/2006 | Craig | 174/67 |
| 7,059,877 | B2 * | 6/2006 | Guzelderli | 439/142 |
| 7,273,383 | B1 * | 9/2007 | Bennett | 439/142 |

* cited by examiner

FACEPLATE WITH DUST-PROOF SHUTTER

CROSS-REFERENCE TO RELATED APPLICATION

This application claims the benefit of Chinese Patent Application No. 200810205398.7 filed on Dec. 30, 2008 in the State Intellectual Property Office of China, the disclosure of which is incorporated herein by reference.

BACKGROUND OF THE INVENTION

1. Field of the Invention

The present invention relates to a faceplate which can be applied and adapted to a connector, and in particular, to a faceplate with a dust-proof shutter.

2. Description of the Related Art

It has been known in the prior arts that a faceplate generally employs a dust-proof shutter structure at a connection port thereof. By virtue of this dust-proof shutter structure, a network connector is isolated from the external environment and dust is prevented from entering into the interior of the connector.

In the current market, the conventional faceplate is often equipped with a common dust-proof shutter that is mounted on the connection port of the faceplate. An elastic member is provided at a back surface of the faceplate. One end of the elastic member connects to a sidewall of the faceplate, and the other end abuts against the dust-proof shutter. In the above dust-proof shutter structure, the dust-proof shutter is kept at an original position where the connection port is closed by virtue of the elasticity from the elastic member. When an external connector plug is required to be inserted into the connection port to achieve a connection, a user usually needs to manually pull the dust-proof shutter to expose the connection port by applying a force on the dust-proof shutter to overcome the elasticity from the elastic member. Once external force from the user is released, the dust-proof shutter will automatically return to the original position by the elasticity from the elastic member to shutter the connection port in the faceplate, so as to shield the dust from the outside.

When in use, user firstly pulls the dust-proof shutter to expose the connection port, and then has to keep holding the dust-proof shutter to maintain the connection port in an opened state so that the external connector plug may be inserted into the connection port. During the above operations, the user has to pull the dust-proof shutter and then keep holding the dust-proof shutter to maintain the connection port in an opened state for a while by one hand. At exactly the same time, the user still has to insert the external connector plug into the connection port by the other hand to achieve a connection. Obviously, it is rather difficult for the user to perform all these operations by both hands at one time. Moreover, since the connection port and the dust-proof shutter both are very small in size, the above operations are always troublesome.

In some circumstances, the user holds the external connector plug, resists a front end of the external connector plug against a side surface of the dust-proof shutter, pushes the dust-proof shutter against the elastic member, and then inserts the external connector plug into the connection port of the faceplate. However, some external connector plugs, such as RJ (Registered Jack) module connector plug, can not be done with the above operations. Also, due to variations of the plugs, these operations can not be applied to some types of external connector plugs. For example, a plug having a stepped structure can not be connected to the connection port by these operations. During connecting such type of plug to the port, since the dust-proof shutter will return immediately under the elasticity from the elastic member, only the front portion of the plug having a smaller diameter can be easily inserted into the connection port while the rear portion having a larger diameter still can not be easily inserted into the connection port. What's more, an optical plug, which has higher requirements on its connection, can not be connected through this way, either.

Accordingly, it is desired in the art to provide a faceplate with a dust-proof shutter, in which the dust-proof shutter is able to be held in an opened position so as to facilitate the connection of the external connector plug.

SUMMARY OF THE INVENTION

The present invention has been made to overcome or alleviate at least one aspect of the above mentioned disadvantages. Accordingly, it is an object of the present invention to provide a faceplate with a dust-proof shutter, in which the dust-proof shutter is able to be held in an opened position while a connection port is in an opened state, and the dust-proof shutter is able to return to a closed position to close the connection port.

Another object of the present invention is to provide a faceplate with a dust-proof shutter, wherein the dust-proof shutter not only has a simple structure but also is easy to be operated.

According to an aspect of the present invention, there is provided a faceplate with a dust-proof shutter, comprising: a faceplate body; a connection port provided in the faceplate body and adapted for plugging and unplugging; a dust-proof shutter for covering the connection port, wherein the dust-proof shutter is able to move between a closed position and an opened position so that the connection port is able to be switched between a closed state and an opened state; and a dust-proof shutter locating unit being able to locate the dust-proof shutter in the closed position and the opened position respectively, in response to the action of the dust-proof shutter.

In one preferred embodiment, the connection port is configured to be a connection port module detachably provided in the faceplate body, and the dust-proof shutter is provided at the connection port module.

Particularly, the dust-proof shutter locating unit comprises: a first locating member for locating the dust-proof shutter in the closed position; and a second locating assembly cooperated with the first locating member to locate the dust-proof shutter in the opened position.

In another preferred embodiment, the first locating member comprises: a first elastic element for exerting an elastic force on the dust-proof shutter, wherein the first elastic element has one end fixed on the faceplate body and the other end resisted against the dust-proof shutter so as to locate the dust-proof shutter in the closed position by the elastic force.

Specifically, the second locating assembly comprises: a locating element pivotally connected to the faceplate body at one end thereof, wherein the locating element has a length L1 from the pivot point thereof to the other end thereof, and the length L1 is larger than a vertical distance H1 from the pivot point to the dust-proof shutter; a stopper protruded from the dust-proof shutter; and a reset mechanism for changing the direction of the movement of the locating element; wherein when the dust-proof shutter is pushed from the closed position to the opened position, the other end of the locating element is resisted against the stopper so that the dust-proof shutter overcomes the elastic force of the locating element and is located on the opened position, and when the dust-proof shutter is further pushed until the other end of the locating element disengages from the dust-proof shutter, the dust-proof shutter changes the direction of the movement thereof under the action of the reset mechanism and returns to the closed position by the elastic force of the first locating member.

Further, the reset mechanism of the second locating assembly comprises: an elongated through hole formed in the dust-proof shutter; and two second elastic elements oppositely disposed at both sides of the locating member and respectively connected to the locating member; wherein each of the two second elastic elements has one end fixed on the faceplate body and the other end connected to the locating member; wherein when the dust-proof shutter is in the closed position, the other end of the locating member is received in the elongated through hole by virtue of the elastic force of the second elastic elements.

Particularly, the stopper takes a wedge shape, with a slant surface and a stop surface that is substantially perpendicular to the dust-proof shutter; wherein during the dust-proof shutter being pushed to the opened position, the other end of the locating member slips over the slant surface of the stopper until being resisted against the stop surface so as to locate the dust-proof shutter in the opened position.

In further another preferred embodiment, the second locating assembly further comprises: a locating shaft provided on the faceplate body and to which the locating member is pivotally connected.

In still another preferred embodiment, the first elastic element is a torsion spring and the second elastic elements are configured to be a pair of extension springs, wherein the elastic force of the torsion spring is larger than that of the extension springs.

Preferably, the stopper is fixed at a side of the dust-proof shutter that is far away from the first locating member.

Furthermore, the dust-proof shutter locating unit is provided on at a side wall of the faceplate body adapted to connect the external connector plug.

Preferably, the dust-proof shutter moves along a direction substantially perpendicular to a direction along which the external connector plug is inserted into the faceplate body.

As apparent from the above, the present invention has at least the following advantages: the faceplate with a dust-proof shutter additionally provides a dust-proof shutter locating unit capable of locating the dust-proof shutter in a closed position and an opened position respectively to facilitate the insertion and removal of the external connector plug. According to the present invention, the dust-proof shutter is able to be held in the opened position where the connection port is in an opened state, and the dust-proof shutter is capable of being timely returned to the closed position to close the connection port. The faceplate with a dust-proof shutter of the present invention has a simple structure, and also, it is easy to operate. It should be noted that, according to the faceplate with dust-proof shutter of the present invention, the dust-proof shutter locating unit may be applied not only into the network connector but also into other similar connectors in the art.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF PREFERRED EMBODIMENTS OF THE INVENTION

Figure 1:
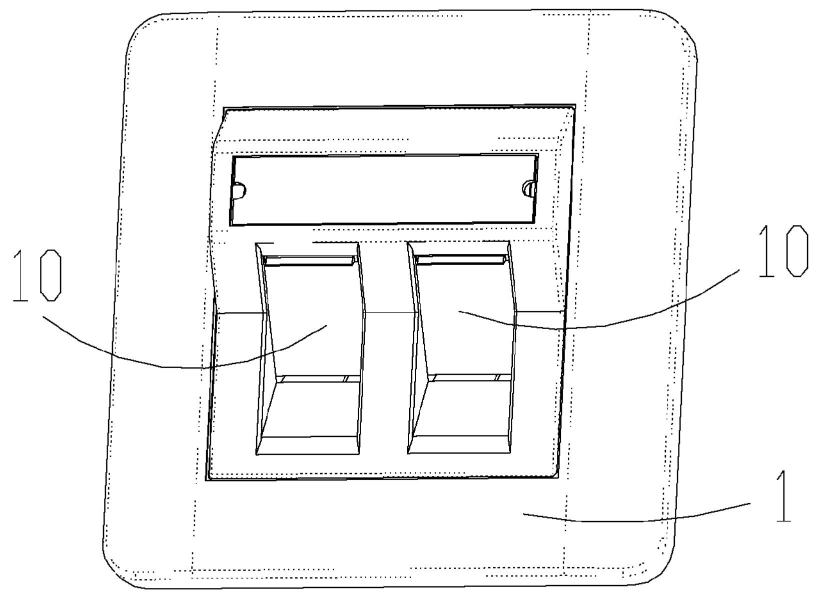
FIG. 1 is a schematic view of a faceplate with a dust-proof shutter according to a preferred embodiment of the present invention, illustrating a condition that the dust-proof shutter is in a closed position.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

The scope of the present invention will in no way be limited to the simply schematic views of the drawings, the number of constituting members, the materials thereof, the shapes thereof, the relative arrangement thereof, etc., but illustrated simply as an example of an embodiment.

Figure 2:
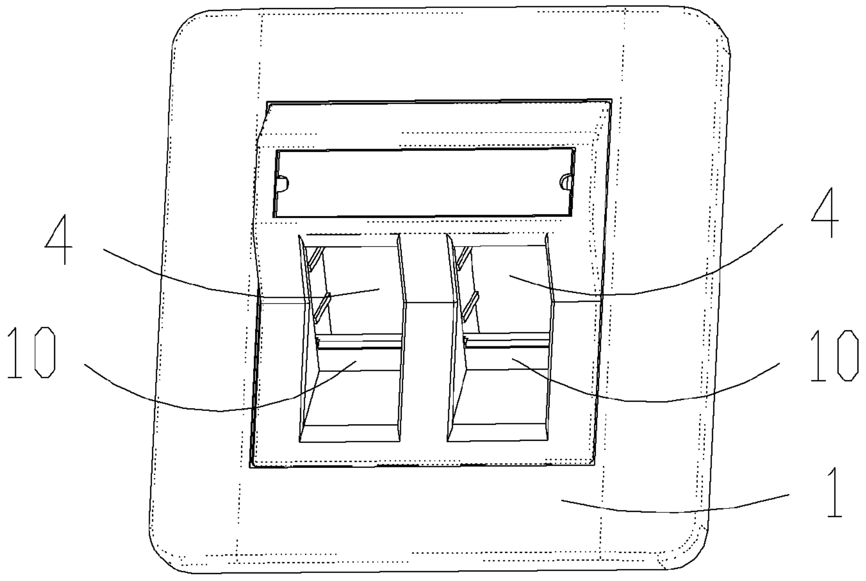
FIG. 2 is another schematic view of the faceplate with the dust-proof shutter according to above preferred embodiment of the present invention, illustrating a condition that the dust-proof shutter is in an opened position.
Figure 3:
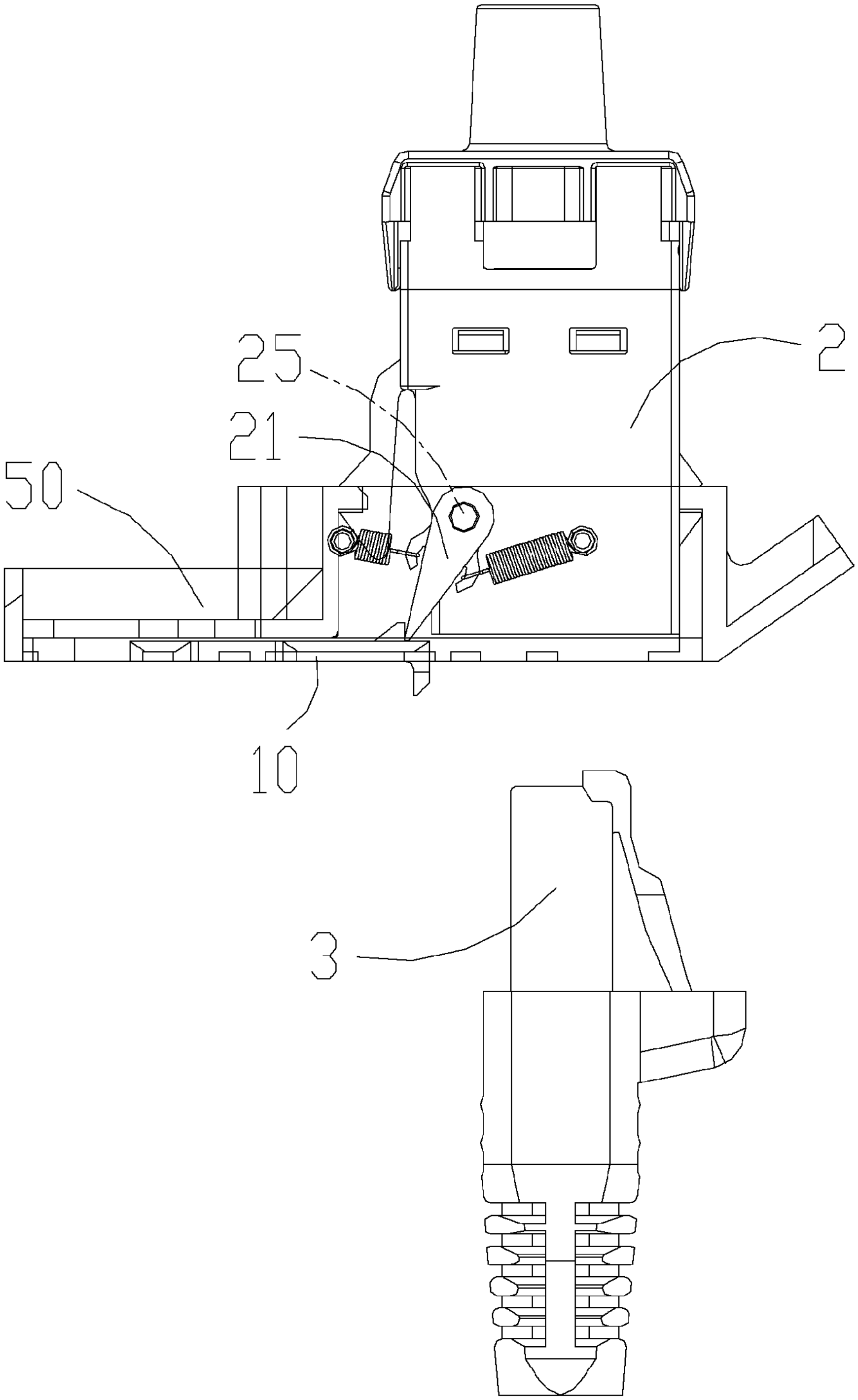
FIG. 3 is a schematic view of the faceplate with the dust-proof shutter in use according to above preferred embodiment of the present invention, illustrating a situation that an external connector is connected to the faceplate.

The present invention provides a faceplate with a dust-proof shutter, which will be applied in a field of connector, especially in a field of network connector. The faceplate with dust-proof shutter is used for achieving the connection between an external connector (such as an external connector plug 3) and an electrical module 2 in the faceplate. As shown in FIGS. 1-3, the faceplate with dust-proof shutter mainly comprises a faceplate body 1, a connection port 4 provided in the faceplate body 1 and adapted for plugging and unplugging, and a dust-proof shutter 10 covering the connection port for dust prevention. The dust-proof shutter 10 that covers the connection port 4 is configured to be able to move between a closed position and an opened position so that the connection port 4 of the faceplate body 1 is able to correspondingly switch between a closed state and an opened state. The faceplate with dust-proof shutter further includes a dust-proof shutter locating unit. When the dust-proof shutter 10 moves, in response to the action of the dust-proof shutter 10, the dust-proof shutter locating unit is able to locate the dust-proof shutter 10 in the closed position and the opened position so that the connection port 4 can be correspondingly shifted in the closed state or in the opened state. Hence, it is easy for the user to insert/remove the external connector plug 3 into/out of the connection port 4. FIG. 1 shows a schematic view that the dust-proof cover 10 of the faceplate is located in the closed position, in which the connection port 4 in the faceplate is covered by the dust-proof shutter, i.e., in the closed state. FIG. 2 shows a schematic view that the dust-proof cover 10 of the faceplate is located in the opened position, in which the connection port 4 in the faceplate is in the opened state for facilitating the insertion of the plug 3.

Figure 4:
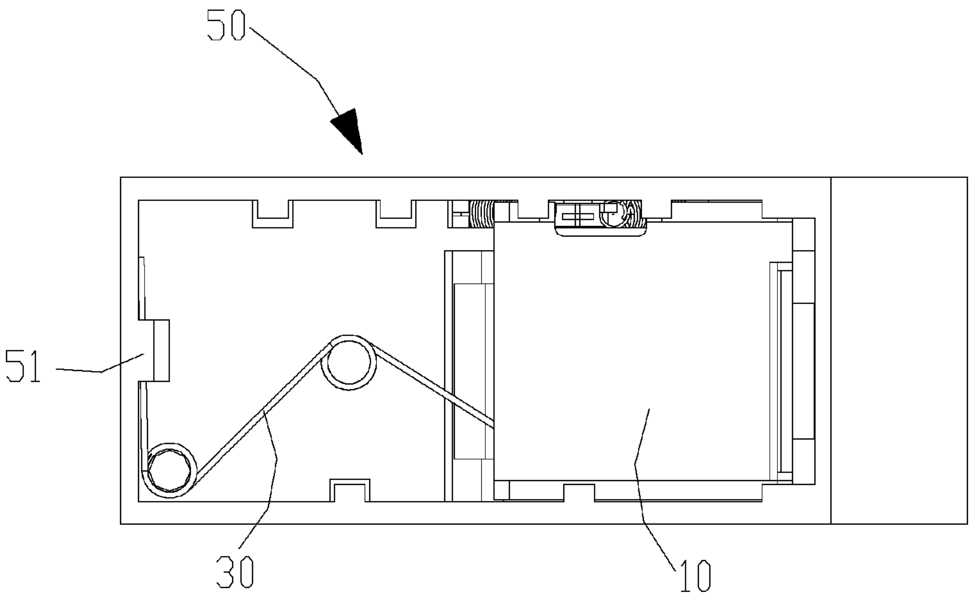
FIG. 4 is a side view of the faceplate with the dust-proof shutter according to above preferred embodiment of the present invention.
Figure 5:
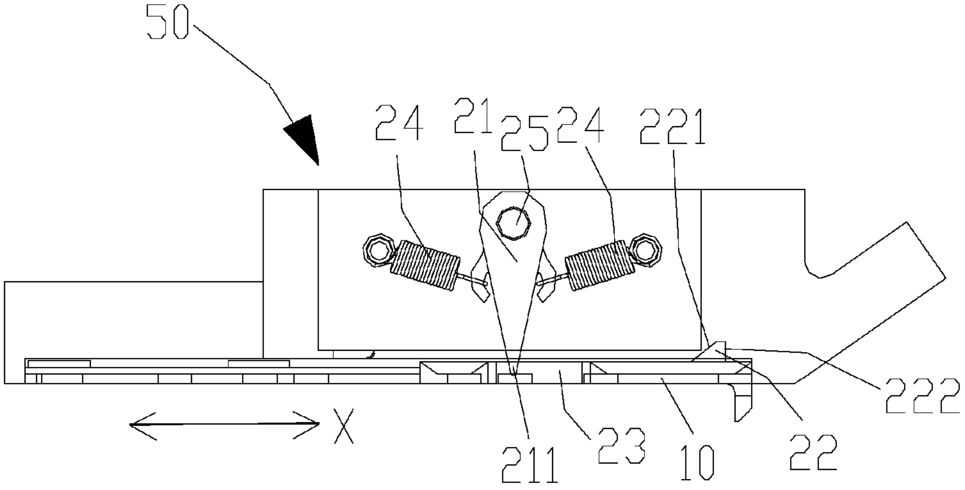
FIGS. 5-10 are schematic views of the faceplate with dust-proof shutter according to above preferred embodiment of the present invention, showing a series of actions by which the dust-proof shutter is operated from the closed position to the opened position and finally return to the closed position when the faceplate with the dust-proof shutter is in use.

According to the preferred embodiment of the present invention, as shown in FIGS. 3-5, the faceplate with dust-proof shutter mainly comprises a faceplate body 1 having a connection port 4 provided therein, a dust-proof shutter 10 covering the connection port, and a dust-proof shutter locating unit which is operable in response to the action of the dust-proof shutter 10. Meanwhile, the faceplate with dust-proof shutter of the present invention further comprises a connection port module 50 detachably disposed at the connection port 4 in the faceplate body 1. Specifically, in this preferred embodiment, the connection port module 50 includes the dust-proof shutter 10 and the dust-proof shutter locating unit is operable in response to the action of the dust-proof shutter 10 so as to locate it. As shown in FIG. 4, the dust-proof shutter 10 moves along an X-direction that is substantially perpendicular to a direction along which the external connector plug is inserted into the faceplate body 1. Obviously, the connection port module 50 can be integrally formed with the faceplate body 1 so that the dust-proof shutter 10 and the dust-proof shutter locating unit are directly disposed on the faceplate body 1.

According to the present invention, the dust-proof shutter locating unit mainly comprises a first locating member for locating the dust-proof shutter 10 in the closed position; and a second locating assembly cooperated with the first locating member to locate the dust-proof shutter 10 in the opened position. In above preferred embodiment, the dust-proof shutter locating unit is provided at a side wall of the faceplate body 1 where the external connector plug is connected to the connection port. Obviously, in other embodiments, the specific location of the dust-proof shutter locating unit may be provided at other positions of the faceplate body 1 as required.

The first locating member is configured to be a first elastic element elastically provided on the dust-proof shutter 10. The first elastic member has one end mounted on the faceplate body 1 and the other end resisted against the dust-proof shutter 10 to locate the dust-proof shutter 10 in the closed position by virtue of elastic force. In the preferred embodiment, as shown in FIG. 4, the first locating member of the dust-proof shutter locating unit is embodied as a torsion spring 30. The torsion spring 30 is disposed in a plane surface along which the dust-proof shutter 10 moves, and the action of torsion spring 30 is correspondingly restricted in the X-direction. Specifically, a fixing block 51 protrudes from one side of the connection port module 50, and one elastic arm of the torsion spring 30 is fixed on the fixing block 51 while the other elastic arm of the torsion spring 30 is resisted against a side wall of the dust-proof shutter 10. Therefore, by the elastic force of the torsion spring 30, the dust-proof shutter 10 is located in a closed position so as to maintain the connection port 4 of the faceplate body 1 in the closed state. However, please be noted that this present invention is not limited to this, the first locating member may be any other elastic locating members which may movably hold the dust-proof shutter 10 of the present invention in the closed position.

In the preferred embodiment, the second locating assembly comprises: a locating element 21 pivotally provided on the faceplate body 1, a stopper 22 protruded from the dust-proof shutter, and a reset mechanism for changing the direction of the movement of the locating element 21. As shown in FIG. 5, according to the present invention, a locating shaft 25 is formed at a side wall of the connection port module 50, and the locating element 21 is pivotally provided on the locating shaft 25. Specifically, the locating element 21, in a ratchet-like shape, has one end (distal end) pivotally connected to the side wall of the connection port module 50 and the other end (tip end 211) disposed to back surface of the dust-proof shutter 10, wherein the locating element 21 has a length L1 from the pivot point of the locating element 21 to the other end 211 of the locating element 21. The length L1 is larger than a vertical distance H1 from the pivot point (i.e., at the locating shaft 25) of the locating element 21 to the dust-proof shutter 10. In this way, the locating element 21 is biased between the dust-proof shutter 10 and the locating shaft 25. At the same time, the protruded stopper 22 is also formed at the back surface of the dust-proof shutter 10, and the stopper 22 is fixed at one side, far away from the torsion spring 30 (the first locating member), of the dust-proof shutter 10. Furthermore, the stopper 22 is in a wedge shape and has a stop surface 222 substantially perpendicular to the back surface of the dust-proof shutter 10 and a slant surface 221 resisted slantwise against the back surface of the dust-proof shutter 10. When the dust-proof shutter 10 is pushed to the opened position, the tip end 211 of the locating element 21 is resisted against the stopper 22 at the back surface of the dust-proof shutter 10. Further, while the dust-proof shutter 10 is pushed to the opened position, the tip end 211 of the locating member 21 slips over the slant surface 221 of the stopper 22 until it is resisted against the stop surface 222 of the stopper 22 so that the dust-proof shutter 10 can overcome the elastic force from the torsion spring 30 (the first locating member) to be located in the opened position, achieving the location of the dust-proof shutter 10, namely holding the dust-proof shutter 10 in the opened position and maintaining the connection port 4 in the opened state.

When the dust-proof shutter 10 is further pushed until the tip end 211 of the locating element 21 disengages from the dust-proof shutter 10, the dust-proof shutter 10 changes the direction of the movement thereof under the action of the reset mechanism and returns to the closed position by virtue of the elastic force from the torsion spring 30 (the first locating member), pushing the connection port 4 back to the closed state. The reset mechanism of the second locating assembly comprises: an elongated through hole 23 formed in the dust-proof shutter 10; and two second elastic elements 24 oppositely disposed at both sides of the locating member 21 and respectively connected to the locating member 21, for resetting and reversing the locating member 21. Each of the two second elastic elements 24 has one end fixed on the connection port module 50 and the other end connected to the locating member 21. When the dust-proof shutter 10 is in the closed position, the tip end 211 of the locating member 21 is received in the elongated through hole 23 by the elastic force from the second elastic elements 24. It shall be noted that the second elastic elements are embodied as a pair of extension springs while the first elastic element is embodied as the torsion spring 30, wherein the elastic force of the torsion spring as the first elastic element is larger than that of the extension springs 24 as the second elastic elements.

The structure of the faceplate with dust-proof shutter according to the preferred embodiment of the present invention and the principle of operation thereof have been described and illustrated as above. The usage of the faceplate with dust-proof shutter of the present invention will be described hereinafter in detail with reference to the attached drawings.

As shown in FIGS. 3-10, when the faceplate with dust-proof shutter is in an original state, the dust-proof shutter 10 is in a closed position under the elastic action of the torsion spring 30 (the first elastic element), see FIGS. 4 and 5, and the connection port 4 is in a closed state. Also, the locating element 21 of the second locating assembly has the tip end 211 thereof received in the elongated through hole 23 by the elasticity of the two extension springs 24 (the second elastic element), and the locating element 21 is perpendicular to the back surface of the dust-proof shutter 10. In this moment, the second elastic element does not work on the location of the dust-proof shutter 10.

Figure 6:
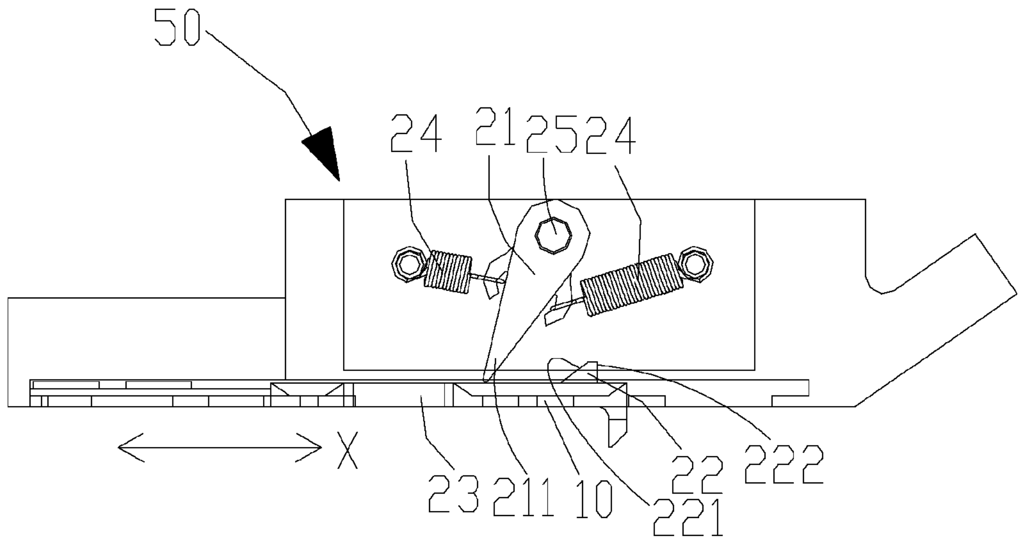
Figure 7:
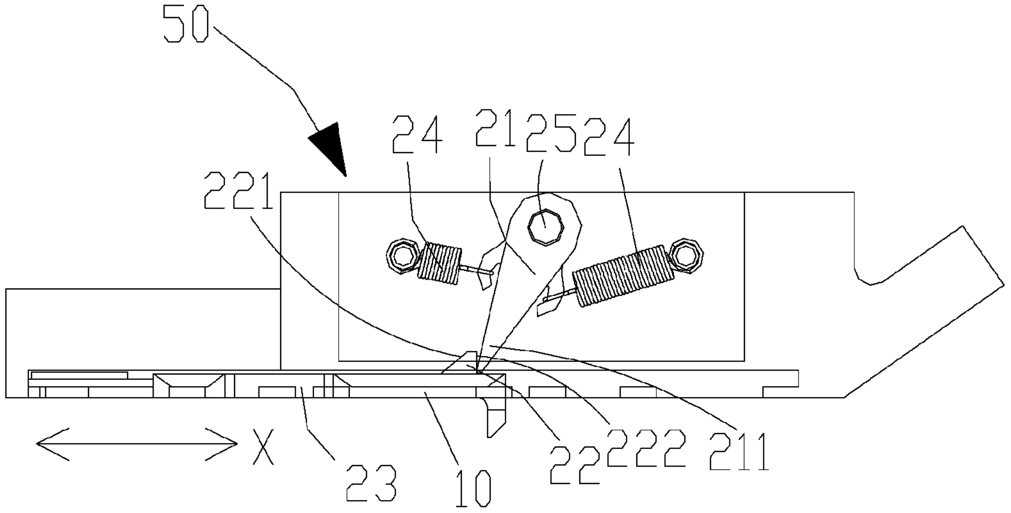

During the dust-proof shutter 10 is pushed from the closed position to the opened position by an external force, the dust-proof shutter 10 moves along the X-direction toward the left, meanwhile, the tip end 211 of the locating element 21 leaves the elongated through hole 23, overcomes the elasticity of the two extension springs 24, and starts to deflect, as shown in FIG. 6. Then, the tip end 211 starts to slip on the back surface of the dust-proof shutter 10 and continues to slip on the slant surface 221 of the stopper 22. When the dust-proof shutter 10 is pushed to the opened position, the tip end 211 of the locating element 21 slips over the slant surface 221 of the stopper 22 and resists against the stop surface 222 of the locating element 21, as shown in FIG. 7. Thereby, the dust-proof shutter 10 is located in the opened position so as to hold the connection port in the opened state. In this way, the user may easily insert the external connector plug 3, for example a plug of an optical connector, into the connection port 4 of the faceplate, electrically connecting the external connector plug 3 with the electrical module 2, such as RJ module, inside the faceplate.

Figure 8:
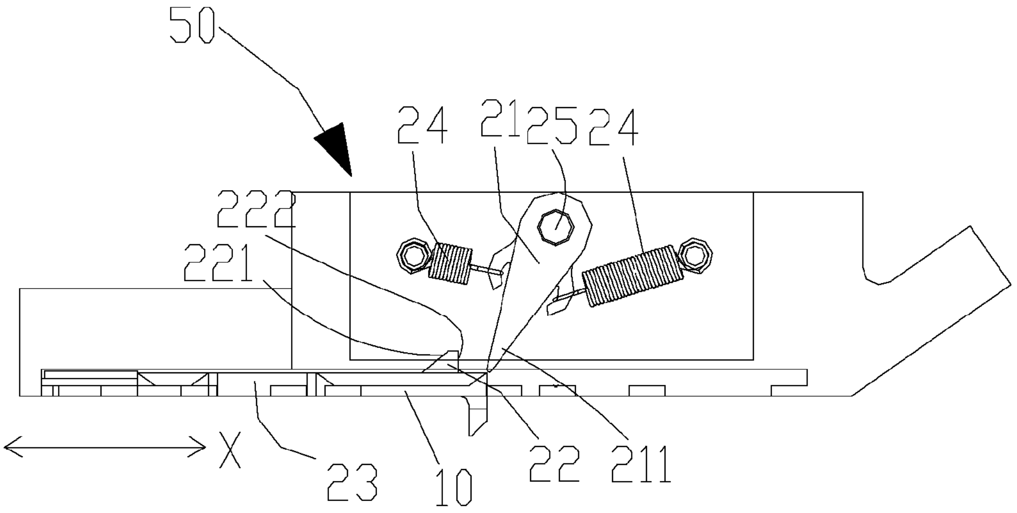
Figure 9:
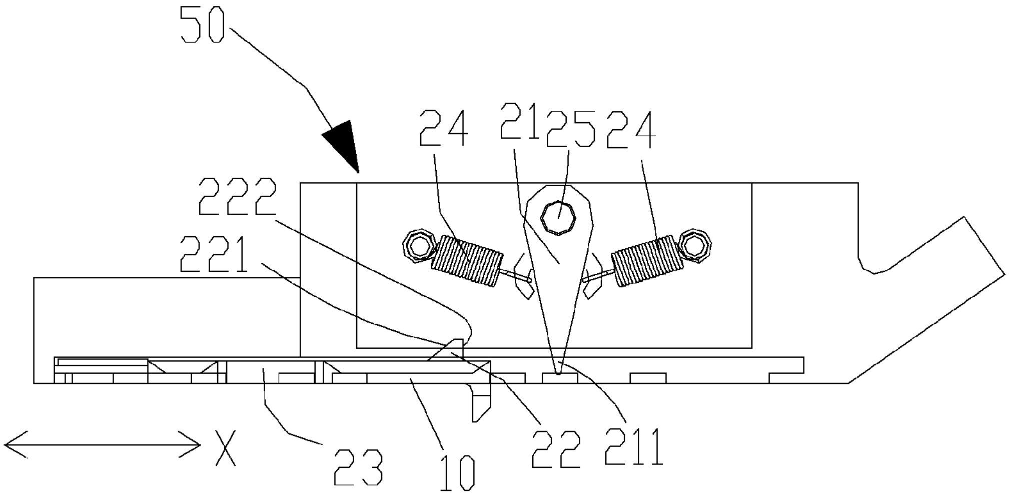

On the other hand, after the external connector plug 3 is removed from the connection port 4, the connection port 4 is required to return to the closed state and the dust-proof shutter 10 needs to be returned to the closed position. At this moment, after the external connector plug 3 is removed, the dust-proof shutter 10 may be further pushed along the X-direction toward the left by an external force so that the tip end 211 of the locating element 21 resisted against the stopper 22 leaves the stop surface 221 and continues to slip on the back surface of the dust-proof shutter 10 until the tip end 211 of the locating element 21 disengages from the back surface of the dust-proof shutter 10, as shown in FIG. 8. Then, the locating element 21 returns to the position in which the locating element 21 is perpendicular to the back surface of the dust-proof shutter 10 by the elasticity of the two extension springs 24 (the second elastic element), as shown in FIG. 9.

Figure 10:
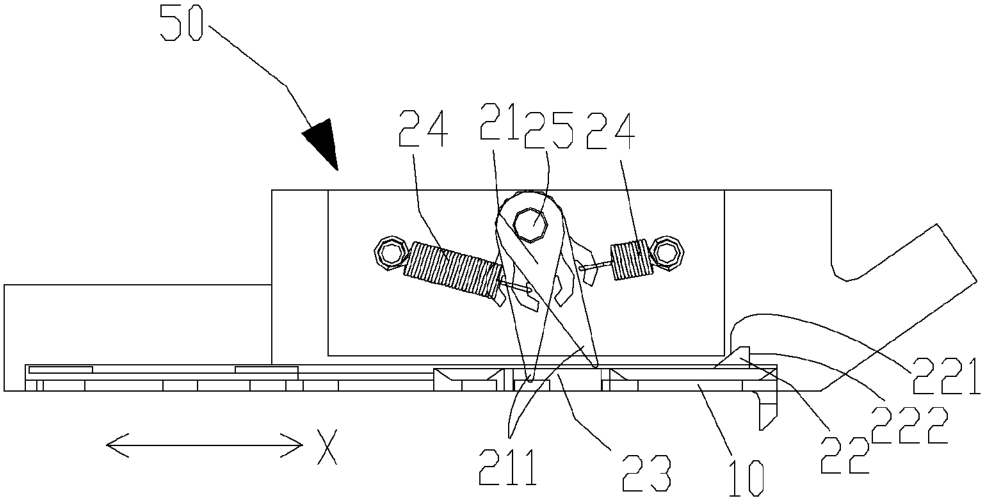

At this time, once the user releases exerting the external force, the dust-proof shutter 10 rebounds to the closed position by the elasticity of the torsion spring 30 to restore the connection port 4 in the closed state. Meanwhile, as shown in FIG. 10, the locating element 21 reverses its deflection direction and slips over the back surface of the dust-proof shutter 10 with the movement of the dust-proof shutter 10, until the tip end 211 of the locating element 21 receives again in the elongated through hole 23, waiting for next opening of the dust-proof shutter 10.

It shall be noted that, the connection port module 50 disclosed in the specification, may be detachably mounted on the connection port 4 of the faceplate body 1 (as described in the preferred embodiment), or may be integrally formed with the faceplate body 1. In the situation that it is integrally formed with the faceplate body 1, the dust-proof shutter 10 and the dust-proof shutter locating unit are directly provided on the faceplate body 1.

Although several exemplary embodiments have been shown and described, it would be appreciated by those skilled in the art that various changes or modifications might be made in these embodiments without departing from the principles and spirit of the disclosure, the scope of which is defined in the claims and their equivalents.

What is claimed is:

1. A faceplate, comprising:

a faceplate body;

a connection port provided in said faceplate body and adapted for plugging and unplugging;

a dust-proof shutter for covering said connection port, wherein said dust-proof shutter can move between a closed position and an opened position so that said connection port can be switched between a closed state and an opened state; and a dust-proof shutter locating unit, being able to locate said dust-proof shutter in said closed position and said opened position respectively, in response to the action of said dust-proof shutter, wherein when the dust-proof shutter is moved in a first direction from the closed position to the open position, the locating unit is moved into a locked position maintaining the dust-proof shutter in the open position, and when the dust-proof shutter is moved further in the first direction, the locating unit resets, and the locating unit returns the dust-proof shutter to the closed position.

2. The faceplate according to claim 1, wherein said connection port is configured to be a connection port module detachably provided in said faceplate body, and said dust-proof shutter is provided on said connection port module.

3. The faceplate according to claim 1, wherein said dust-proof shutter locating unit comprises a first locating member for locating said dust-proof shutter in said closed position; and a second locating assembly cooperating with said first locating member to locate said dust-proof shutter in said opened position.

4. The faceplate according to claim 3, wherein said first locating member comprises a first elastic element for exerting an elastic force on said dust-proof shutter, wherein said first elastic element has one end fixed on said faceplate body and the other end resisted against said dust-proof shutter so as to locate said dust-proof shutter in said closed position by the elastic force.

5. The faceplate according to claim 4, wherein said second locating assembly comprises;

a locating element pivotally connected to said faceplate body at one end thereof, wherein said locating element has a length L1 from the pivot point thereof to the other end thereof, and the length L1 is larger than a vertical distance H1 from said pivot point to said dust-proof shutter;

a stopper protruding from said dust-proof shutter; and a reset mechanism for changing the direction of the movement of said locating element;

wherein when said dust-proof shutter is pushed from said closed position to said opened position, said other end of said locating element is resisted against said stopper so that said dust-proof shutter overcomes the elastic force of said first locating element and is located on said opened position, and when said dust-proof shutter is further pushed until said other end of said locating element disengages from said dust-proof shutter, said dust-proof shutter changes the direction of the movement thereof under the action of said reset mechanism and returns to said closed position by the elastic force of said first locating member.

6. The faceplate according to claim 5, wherein said reset mechanism of said second locating assembly comprises:

an elongated through hole formed in said dust-proof shutter; and two second elastic elements oppositely disposed at both sides of said locating member and respectively connected to said locating member; wherein each of said two second elastic elements has one end fixed on said faceplate body and the other end connected to said locating member;

wherein when said dust-proof shutter is in said closed position, said other end of said locating member is received in said elongated through hole by virtue of the elastic force of said second elastic elements.

7. The faceplate according to claim 6, wherein said stopper is Wedge-shaped, with a slant surface and a stop surface that is substantially perpendicular to said dust-proof shutter; wherein while said dust-proof shutter is pushed to said opened position, said other end of said locating member slips over said slant surface of said stopper until it is resisted against said stop surface so as to locate said dust-proof shutter in said opened position.

8. The faceplate according to claim 7, wherein said second locating assembly further comprises a locating shaft provided on said faceplate body and to which said locating member is pivotally connected.

9. The faceplate according to claim 6, wherein said first elastic element is configured to be a torsion spring and said second elastic elements are configured to be a pair of extension springs, wherein the elastic force of said torsion spring is larger than that of the extension springs.

10. The faceplate according to claim 5, wherein said stopper is fixed at a side of said dust-proof shutter that is away from said first locating member.

11. The faceplate according to claim 1, wherein said dust-proof shutter locating unit is provided on a side wall of said faceplate body where the connection port is connected to an external connector plug.

12. A faceplate, comprising:

a faceplate body;

a connection port provided in said faceplate body and adapted for plugging and unplugging;

a dust-proof shutter for covering said connection port, wherein said dust-proof shutter can move between a closed position and an opened position so that said connection port can be switched between a closed state and an opened state; and a dust-proof shutter locating unit, being able to locate said dust-proof shutter in said closed position and said opened position respectively, in response to the action of said dust-proof shutter; said dust-proof shutter locating unit comprises a first locating member for locating said dust-proof shutter in said closed position; and a second locating assembly cooperating with said first locating member to locate said dust-proof shutter in said opened position;

said first locating member comprises:

a first elastic element for exerting an elastic force on said dust-proof shutter, wherein said first elastic element has one end fixed on said faceplate body and the other end resisted against said dust-proof shutter so as to locate said dust-proof shutter in said closed position by the elastic force;

said second locating assembly comprises:

a locating element pivotally connected to said faceplate body at one end thereof, wherein said locating element has a length L1 from the pivot point thereof to the other end thereof, and the length L1 is larger than a vertical distance H1 from said pivot point to said dust-proof shutter;

a stopper protruding from said dust-proof shutter; and a reset mechanism for changing the direction of the movement of said locating element;

wherein when said dust-proof shutter is pushed from said closed position to said opened position, said other end of said locating element is resisted against said stopper so that said dust-proof shutter overcomes the elastic force of said first locating element and is located on said opened position, and when said dust-proof shutter is further pushed until said other end of said locating element disengages from said dust-proof shutter, said dust-proof shutter changes the direction of the movement thereof under the action of said reset mechanism and returns to said closed position by the elastic force of said first locating member.

13. The faceplate according to claim 12, wherein said connection port is configured to be a connection port module detachably provided in said faceplate body, and said dust-proof shutter is provided on said connection port module.

14. The faceplate according to claim 12, wherein said reset mechanism of said second locating assembly comprises:

an elongated through hole formed in said dust-proof shutter; and two second elastic elements oppositely disposed at both sides of said locating member and respectively connected to said locating member; wherein each of said two second elastic elements has one end fixed on said faceplate body and the other end connected to said locating member;

wherein when said dust-proof shutter is in said closed position, said other end of said locating member is received in said elongated through hole by virtue of the elastic force of said second elastic elements.

15. The faceplate according to claim 12, wherein said stopper is Wedge-shaped, with a slant surface and a stop surface that is substantially perpendicular to said dust-proof shutter;

wherein while said dust-proof shutter is pushed to said opened position, said other end of said locating member slips over said slant surface of said stopper until it is resisted against said stop surface so as to locate said dust-proof shutter in said opened position.

16. The faceplate according to claim 12, wherein said second locating assembly further comprises a locating shaft provided on said faceplate body and to which said locating member is pivotally connected.

17. The faceplate according to claim 12, wherein said first elastic element is configured to be a torsion spring and said second elastic elements are configured to be a pair of extension springs, wherein the elastic force of said torsion spring is larger than that of the extension springs.

18. The faceplate according to claim 12, wherein said stopper is fixed at a side of said dust-proof shutter that is away from said first locating member.

19. The faceplate according to claim 12, wherein said dust-proof shutter locating unit is provided on a side wall of said faceplate body where the connection port is connected to an external connector plug.

20. A faceplate, comprising:

a faceplate body;

a connection port provided in said faceplate body and adapted for plugging and unplugging;

a dust-proof shutter for covering said connection port, wherein said dust-proof shutter can move between a closed position and an opened position so that said connection port can be switched between a closed state and an opened state;

a dust-proof shutter locating unit, being able to locate said dust-proof shutter in said closed position and said opened position respectively, in response to the action of said dust-proof shutter, the dust-proof shutter locating unit comprising a first locating member comprising a first elastic element for exerting an elastic force on said dust-proof shutter into a closed position, and a second locating assembly cooperating with said first locating member to locate said dust-proof shutter in said opened position; and a reset mechanism coupled to the dust-proof shutter for releasing the second locating element from a locked position, whereupon movement of the dust-proof cover activates the reset mechanism and the dust-proof shutter is moved to the closed position under influence of the first locating member.

* * * * *